(12) United States Patent
Matayabas, Jr. et al.

(10) Patent No.: US 6,841,867 B2
(45) Date of Patent: Jan. 11, 2005

(54) GEL THERMAL INTERFACE MATERIALS COMPRISING FILLERS HAVING LOW MELTING POINT AND ELECTRONIC PACKAGES COMPRISING THESE GEL THERMAL INTERFACE MATERIALS

(75) Inventors: James C. Matayabas, Jr., Chandler, AZ (US); Paul A. Koning, Chandler, AZ (US); Ashay A. Dani, Chandler, AZ (US); Christopher L. Rumer, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 155 days.

(21) Appl. No.: 10/334,241

(22) Filed: Dec. 30, 2002

(65) Prior Publication Data

US 2004/0124526 A1 Jul. 1, 2004

(51) Int. Cl.[7] ................ H01L 23/10; H01L 23/34; H01L 23/48; H01L 23/52; H01L 29/40
(52) U.S. Cl. ............... 257/706; 257/707; 257/718; 257/720; 257/747
(58) Field of Search ................. 257/706–748

(56) References Cited

U.S. PATENT DOCUMENTS

| 6,469,379 | B1 | | 10/2002 | Matayabas, Jr. | |
| 6,597,575 | B1 | * | 7/2003 | Matayabas et al. | 361/705 |
| 6,657,297 | B1 | * | 12/2003 | Jewram et al. | 257/720 |
| 2002/0000239 | A1 | * | 1/2002 | Sachdev et al. | 134/2 |

* cited by examiner

Primary Examiner—Tom Thomas
Assistant Examiner—Jesse A. Fenty
(74) Attorney, Agent, or Firm—Blakely, Sokoloff, Taylor & Zafman LLP

(57) ABSTRACT

A composition including an amount of at least one vinyl terminated polymer; an amount of at least one cross-linker comprising a terminal Si—H unit; an amount of at least one thermally conductive first filler, and at least one thermally conductive second filler, wherein a melting point of the first filler is greater than the melting point of the second filler. An apparatus including a package configured to mate with a printed circuit board; a semiconductor device coupled to the package; a thermal element; and a curable thermal material disposed between the thermal element and the semiconductor device.

19 Claims, 3 Drawing Sheets

GEL THERMAL INTERFACE MATERIALS COMPRISING FILLERS HAVING LOW MELTING POINT AND ELECTRONIC PACKAGES COMPRISING THESE GEL THERMAL INTERFACE MATERIALS

BACKGROUND

1. Field

Thermal interface materials.

2. Description of Related Art

In order to meet the market demand for high performance microprocessors, the recent trend in microprocessor architecture has been to increase the number of transistors (higher power), shrink processor size (smaller die), and increase clock speeds (higher frequency). These trends have resulted in the escalation of power dissipation as well as heat flux at the silicon die level, which increase both the raw power as well as power density on silicon.

Thermal materials have been used in packaging as interfaces between devices to dissipate heat from these devices (e.g., microprocessors). One typical thermal interface material (TIM) typically includes a polymer matrix and a thermally conductive filler. The TIM technologies used for electronic packages encompass several classes of materials such as phase change materials, epoxies, greases, and gels.

Phase change materials (PCMs) are in a class of materials that undergo a transition from a solid to a liquid phase with the application of heat. These materials are in a solid state at room temperature and are in a liquid state at die operating temperatures. When in the liquid state, PCMs readily conform to surfaces and provide low thermal interfacial resistance. PCMs offer ease of handling and processing due to their availability in a film form and the lack of post dispense processing. However, from a formulation point, the polymer and filler combinations that have been utilized in PCMs restrict the bulk thermal conductivities of these materials.

Metal filled epoxies commonly are highly conductive materials that thermally cure into highly crosslinked materials. They, however, have significant integration issues with other components of the package. For example, metal filled epoxies exhibit localized phase separation within the material. This is driven by package thermo-mechanical behavior that results in high contact resistance. Furthermore, the high modulus nature of epoxies leads to severe delamination at the interfaces.

Thermal greases offer several advantages compared to other classes of materials including good wetting and ability to conform to the interfaces, no post-dispense processing, and high bulk thermal conductivity. Greases provide excellent performance in a variety of packages; however, greases cannot be used universally with all packages due to degradation of thermal performance during temperature cycling. It is observed that in some packages greases migrate out from between the interfaces under cyclical stresses encountered during temperature cycling. This phenomenon is known as "pump out." The extensive thermo-mechanical stresses exerted at the interface during temperature cycling are due to the relative flexing of the die and the thermal plate with changes in temperature. Because the pump-out phenomenon is inherently related to the formulation chemistries utilized in greases, all typical greases are subject to pump-out.

Many high performance, high power processors require the use of integrated heat spreaders (IHSs). In general, the well-known thermal greases, epoxies, and phase change materials that are currently available in the market do not meet the performance requirement for packages comprising an IHS. PCMs do not possess high enough bulk thermal conductivities necessary to dissipate the high heats from the central processing units, and they typically require the use of external clamps for the application of constant positive force for optimum performance. The highly conductive metal filled epoxy thermal polymers can not be used due to integration issues that lead to delamination and high interfacial resistance. And, greases are limited due to pump-out.

Gels typically include a crosslinkable silicone polymer, such as vinyl-terminated silicone polymer, a crosslinker, and a thermally conductive filler. Gels combine the properties of both greases and crosslinked TIMs. Before cure, these materials have properties similar to grease. They have high bulk thermal conductivities, have low surface energies, and conform well to surface irregularities upon dispense and assembly, which contributes to thermal contact resistance minimization. After cure, gels are crosslinked filled polymers, and the crosslinking reaction provides cohesive strength to circumvent the pump-out issues exhibited by greases during temperature cycling. Their modulus (E') is low enough (in the order of mega-pascal (MPa) range compared to giga-pascal (GPa) range observed for epoxies) that the material can still dissipate internal stresses and prevent interfacial delamination. Thus, the low modulus properties of these filled gels are attractive from a material integration standpoint.

Even though the modulus of the gel-type TIMs currently used in the industry is low, it is not low enough to survive the reliability-stressing test. Commonly assigned U.S. Pat. No. 6,469,379 describes a curable TIM that has lower modulus and improved performance requirements of electronic packages and also survives reliability-stressing tests. In one embodiment, U.S. Pat. No. 6,469,379 describes a TIM including, a vinyl terminated silicon polymer; a silicone cross-linker having terminal silicon-hydride units; a chain extender; and a thermally conductive filler such as a metal (e.g., aluminum, silver, etc.) and/or a ceramic (e.g., aluminum nitride, aluminum oxide, zinc oxide, etc.). While this material has a lower modulus and improved performance over other TIMs, the thermal performance of the material may still not be suitable for performance requirements of current and future generation electronic products.

BRIEF DESCRIPTION OF THE DRAWINGS

The features and advantages of the present invention will become apparent from the following detailed description of the present invention in which.

DETAILED DESCRIPTION

Figure 1:
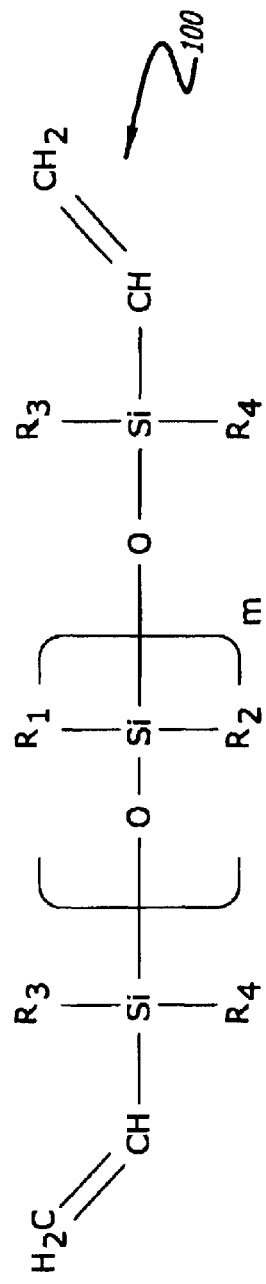
FIG. 1 is a diagram illustrating a polymer chain as one structure component in a formulation of a curable TIM according to one embodiment of the invention.

FIG. 1 is a diagram illustrating one embodiment of a polymer chain as one structure component in a formulation of a curable TIM. Component 100 is a silicone oil based composition. Component 100 includes at least one unit of oxygen-silicon (O—Si) and a plurality of hydrocarbons to make up the silicon oil and vinyl groups. The O—Si group in parenthesis represents a polymer. The subscript "m" to the polymer represents a degree of polymerization and represents a polymer chain of component 100 where "m" is in the range of 10–1000 (i.e., when "m" is equal to 10, the average length of the polymer chain is 10). The silicone-oil base (i.e., O—Si—O—Si with hydrocarbons) when combined with vinyl (e.g., $CH=CH_2$) forms a vinyl-terminated silicone oil having component 100 (where —CH is a methane radical and —$CH_2$ is methylene radical). The vinyl groups are at the ends of the polymer chain. The vinyl-termination of the silicone oil is denoted by the symbol "$H_2C=CH—$" or "—$CH=CH_2$". The vinyl-terminated silicone oil structure (i.e., structure component 100) includes a plurality of hydrocarbons $C_1$ to $C_{26}$. These hydrocarbons are denoted by $R_1$ to $R_4$. It is contemplated that $R_1$, $R_2$, $R_3$, and $R_4$ are independently selected from $C_1$ to $C_{26}$. In other words, that $R_1$, $R_2$, $R_3$, and $R_4$ can be selected to be the same or to be different from aliphatic, cycloaliphatic, and aromatic hydrocarbons comprising 1 to 26 carbon atoms. In one embodiment, silicone oil is vinyl terminated poly (dimethyl siloxane) (i.e., component 100 where $R_1$, $R_2$, $R_3$, and $R_4$ are methyl ($CH_3$)).

Figure 2:
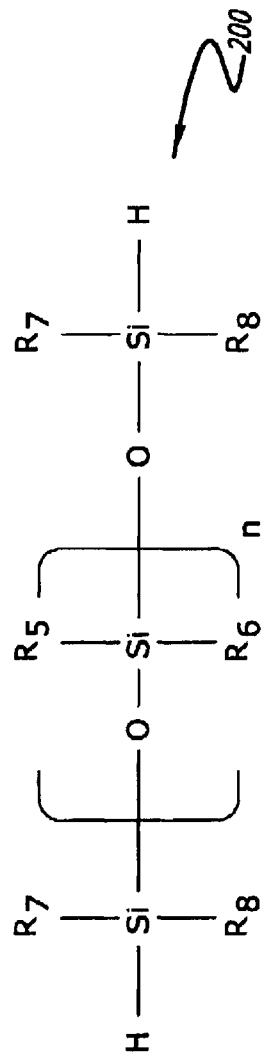
FIG. 2 is a diagram illustrating a chain extender as one structure component in the formulation of the curable TIM according to one embodiment of the invention.

FIG. 2 is a diagram illustrating one embodiment of a chain extender as one structure component in the formulation of the curable TIM. Component 200 includes a silicone oil based material, which is represented by the parenthesis with the subscript "n" (where "n" is the degree of polymerization) and Si—H/H—Si (silicon hydride) at two ends of the silicone oil (e.g., O—Si—O—Si—O—Si, etc., chain structure). Component 200 may be long or short depending on the number of polymer (O—Si) composition used in the structure. In other words, the degree of polymerization, "n", can range from approximately 10 to approximately 10,000. Component 200 (H-terminated silicone oil) may be used as a chain extender for the polymer chain described in FIG. 1. The two hydrogen (H) components are located at the two ends of the silicone oil based material (O—Si—O—Si chain). Component 200 also includes a plurality of hydrocarbons $C_1$ to $C_{26}$, which are denoted by $R_5$ to $R_8$. The $R_5$, $R_6$, $R_7$, and $R_8$ components are independently selected from the $C_1$ to $C_{26}$ hydrocarbons group. In one embodiment, the chain extender is hydrogen terminated poly (dimethyl siloxane) (i.e., component 200 where $R_5$, $R_6$, $R_7$, and $R_8$ are methyl ($CH_3$)). The chain extender is combined with the vinyl-terminated silicone oil to, in one aspect, control the modulus (i.e., shear modulus G') of TIMs (gels). It is observed that TIMs with chain extender have a reduced modulus (i.e., shear modulus G') and thus are better able to absorb these stresses without delaminating from the surfaces. It is also observed that TIMs with chain extender have reduced thermal interfacial resistance and are therefore better able to conduct heat.

Figure 3:
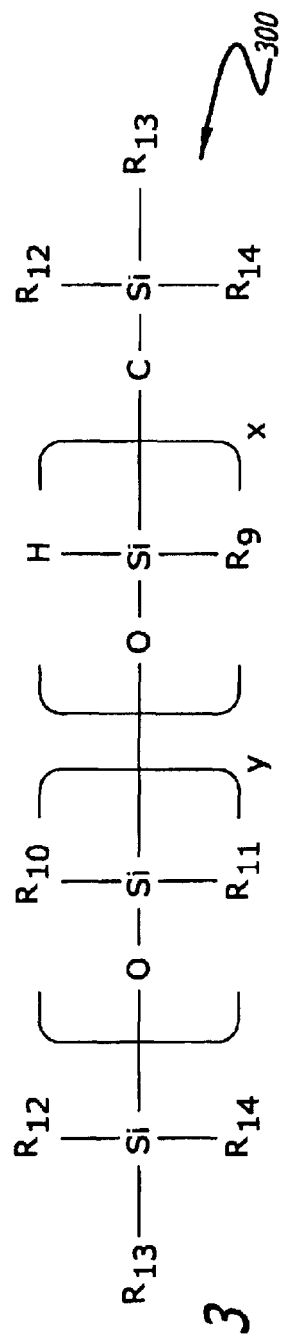
FIG. 3 is a diagram illustrating a crosslinker as one structure component in the formulation of the curable TIM according to one embodiment of the invention.
Figure 4:
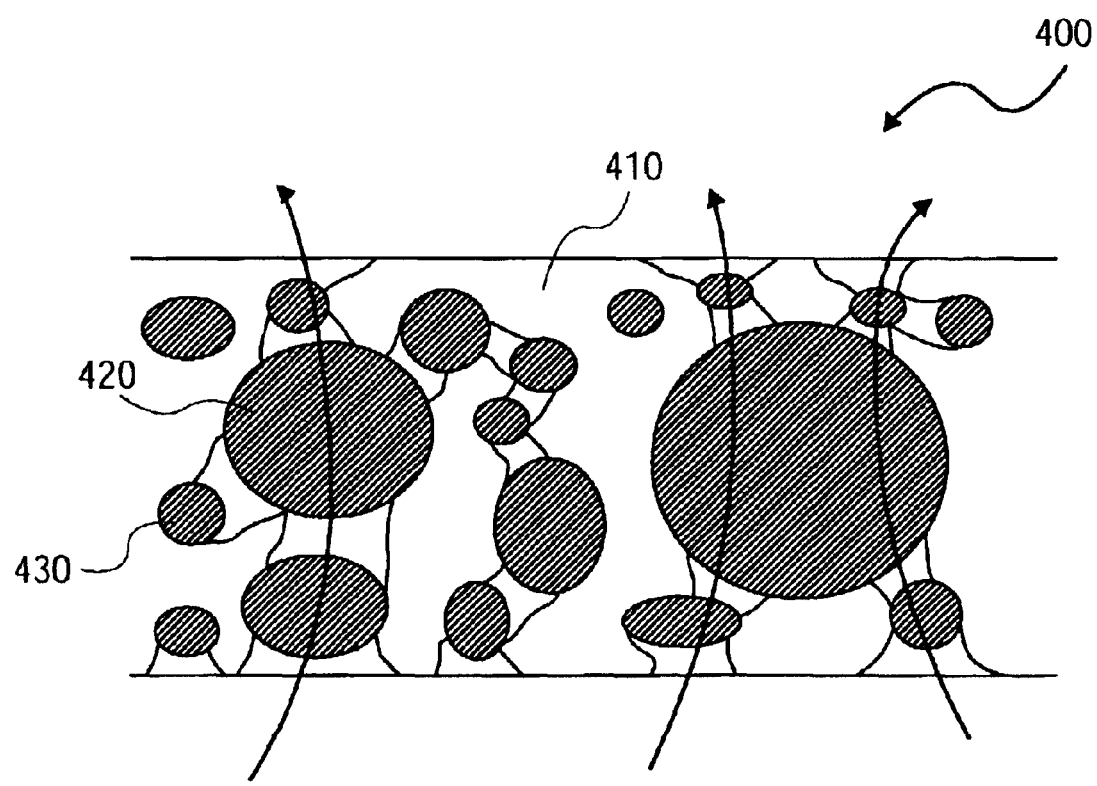
FIG. 4 is a representation of a layer of cured TIM according to one embodiment.

FIG. 3 is a diagram illustrating one embodiment of a crosslinker as one structure component in the formulation of the curable TIM. Crosslinker 300 includes at least one polymer unit (shown in parenthesis with a subscript "y"), at least one crosslinkable unit (shown in bracket with a subscript "x"), silicone and a plurality of hydrocarbons $C_1$ to $C_{26}$, which are denote by $R_9$ to $R_{14}$. $R_9$ to $R_{14}$ and are independently selected from the hydrocarbons $C_1$ to $C_{26}$ group. In one embodiment, $R_1$ to $R_{14}$ are all methyl ($CH_3$). The subscripts "x" and "y" represent the degrees of polymerization where "x" is in the range of 3–100 and "y" is in the range of 10–10,000. Crosslinker 300 when combined with a vinyl terminated silicone oil together with other additives form a basic formulation of gel TIM (as shown in FIG. 4).

In one embodiment, the composition of curable TIM includes at least one vinyl-terminated silicone oil having the structure illustrated by component 100, at least one H-terminated silicone oil having the structure illustrated by component 200, and at least two thermally conductive filler having different melting points. The composition of curable TIM further includes at least one silicone crosslinker illustrated by component 300. In this case (i.e., the component 300 is combined with components 100, 200 and the thermally conductive fillers), the ratio of component 200 to crosslinker 300 is controlled such that mole fraction of Si—H equivalents from the chain extender to the total Si—H equivalents from both crosslinker 300 and component 200 in the formulation is in the range of 0.1 to 1. In one embodiment, this ratio is approximately 0.6. It is contemplated that the formula may contain more than one chain extender and/or crosslinker. Crosslinker 300 in the formulation includes a plurality of silicone hydride (Si—H) units. Component 200 comprises two Si—H units. As stated earlier, these two Si—H units are located at the two ends of the polymer chain. Component 200 tends to reduce the number of crosslinks in the curable TIM. This results in a reduction of the shear modulus (e.g., measured by a rheometer at a curing temperature) that reduces the thermal resistance due to the TIM. With low resistance in the package, the device (e.g., central processing unit (CPU)) can operate at faster speed since the TIM with low resistance can get more heat out from the device. It is contemplated that reducing shear modulus in the TIM also reduces other related moduli. The chain extender may be used with any kind of polymer chains. Silicone thermal gel material is by far more commonly used since it has lower shear modulus than epoxy gel materials (modulus of these material are extremely high and are not commercially used). However, with component 200 as a chain extender, a shear modulus in the silicone thermal gels can be reduced further.

In one embodiment, the curable TIM formulation includes at least one vinyl-terminated silicone oil (i.e., component 100), at least one Si—H crosslinker and a Pt catalyst. After cure, this gel TIM formulation has a low modulus. However, the modulus in this formulation may not be low enough to meet the needs of high performance processors. The crosslinker and the silicone oil are combined to develop a network structure. The modulus value obtained after cure depends in part on the average distance between the crosslink sites. The average distance between the crosslink sites depends upon the values "y" and "x" for the crosslinker (i.e., crosslinker 300), the value of "m" for the silicone oil (i.e., component 100), and the ratio of crosslinker to silicone oil (i.e., the Si—H to Si-vinyl ratio). To make the distance between the crosslink sites longer without raising the viscosity (i.e., without increasing the value of "m" in structure 100 and "y" in crosslinker 300), chain extender (i.e., component 200) may also, optionally, be used. In one embodiment, component 200 is approximately the same size as crosslinker 300 (i.e., the value of "n" in component 200 is about the same as the sum of the values of "y" and "x" in crosslinker 300).

The curable TIM may be formulated by mixing the components together to produce a gel which may be applied by dispensing methods (e.g., syringe) to any particular surface and cured at a certain temperature (i.e., room temperature). In one embodiment, a curable TIM formulation includes at least one vinyl-terminated silicone oil (i.e., component 100), at least one H-terminated silicone oil (e.g., chain extender or component 200), at least one silicone crosslinker (i.e., Si—H crosslinker), and at least two thermally conductive fillers (not shown). These components are combined together to form a low modulus curable TIM formulation. The order of the compositions that are combined together is not critical to the formation of the TIM. Of course, other additive such as catalysts for the curing reaction are included in the compositions. The ratio of Si—H equivalents from the chain extender to the Si—H equivalents from the crosslinker is adjusted such that it would yield a desired modulus value.

The crosslinking reaction that occurs during cure involves the formation of a silicon-carbon bond by reaction of the vinyl group with the silicone hydride group. It is noted that the Si—H to Si-vinyl molar ratio is a critical formulation parameter for controlling the properties of the silicone matrix after cure. However, a wide range of values can be used in practice. The value of Si—H to Si-vinyl ratio is in the range of about 2 to 0.6. The use of Si—H to Si-vinyl values outside this range may result in materials that have G' values outside of the desired range. In one embodiment, the Si—H to Si-vinyl ratio is approximately 1.0.

The chain extension technology described tends to form linear, high molecular weight silicone polymers during cure. Therefore, the base silicone oil can have a wide range of molecular weights. However, silicone oils with low molecular weights are desirable, in one embodiment, because lower molecular weight silicone oils provide TIMs with improved processibility due to their reduced viscosity before cure. Moreover, the use of low molecular weight silicone oil provides improved wetting of fillers due to reduced entropy loss upon becoming confined to the surface of the filler and permits higher filler loadings, which provide higher bulk thermal conductivities.

In one embodiment of a TIM composition, fillers are included in the compositions of the structures shown in FIG. 1 and FIG. 2 or in the composition of structure shown in FIGS. 1, 2 and 3. In one embodiment, the composition includes two different fillers. A first filler is a material with a relatively high melting point (e.g., on the order of 300° C. or greater) or a melting point such that the filler will not melt when the composition is thermally treated (e.g., cured). The first filler also, in one embodiment, has a relatively high bulk thermal conductivity such as on the order of about 50 watts per meter per Kelvin (W/mK). Examples of these fillers include metals, such as aluminum, silver, copper, and the like; ceramics, such as aluminum nitride, aluminum oxide, zinc oxide, boron nitride, aluminum nitride, and the like; silver coated aluminum, carbon fibers, alloys and any combinations thereof.

A wide variety of first filler average particle sizes and particle size distributions can be used in various embodiments. Fillers with larger average filler sizes provide higher bulk thermal conductivities; however, they also give higher bond line thicknesses that reduce thermal performance. Therefore, the average particle size may be selected in a range that balances these factors for a high performance thermal interface material. Typically, the average particle size is less than about 300 microns. In one embodiment, the average particle size is less than approximately 30 microns. In one embodiment, where the first filler is aluminum or a combination of aluminum and zinc oxide, one average particle size of aluminum (thermal conductivity of about 200 W/mK) is on the order of about seven microns. One combination of aluminum and zinc oxide is less than 50 weight percent zinc oxide.

A curable TIM composition also includes a second filler in addition to the first filler. The second filler, in one embodiment, has a melting point that is less than the melting point of the first filler. In one embodiment, the melting point of the second filler is less than 300° C. The second filler also is selected, in one embodiment, to have a bulk thermal conductivity greater than about 10 W/mK. Suitable materials for second filler material include solder materials such as indium, tin, indium-tin alloy, indium-silver alloy tin-bismuth alloy, tin-indium-bismuth alloy, gallium-tin-indium alloy, gallium-indium-tin-zinc alloy, and indium-bismuth alloy.

In one embodiment, a curable TIM composition includes about 40 to 80 volume percent total filler (e.g., first filler plus second filler), with less than 30 volume percent second filler. First filler ranges, in this embodiment, from a maximum of 80 volume percent to a minimum of 10 volume percent. In another embodiment, a gel TIM composition includes 68 to 73 volume percent total filler, with 25 to 27 volume percent second filler and 48 to 41 volume percent first filler.

In one embodiment, a curable TIM composition including the polymer and first filler and second filler may be formed as a gel that can be cured at the point of use, such as between a heat spreader and semiconductor device or die or between a heat spreader and a heat sink.

In order to form the polymer chains described above and properly secure, for example, a thermal element or management device (e.g., integrated heat spreader (IHS), heat pipe, etc.) to a die or a secondary thermal element (e.g., a heat sink), the gel TIM composition is cured. In one embodiment, during cure, the gel TIM composition is heated to a melting point above the melting point of the second filler but below the melting point of the first filler. Where a solder material is used in the curable TIM composition as the second filler material, the composition is heated by a reflow process (e.g., 183° C. or greater for a low melt solder or 260° C. or greater for a high melt solder) to at least the melting point of the solder and below the temperature of the first filler. When heated to such a temperature, the second filler tends to fuse the non-melting first filler to create continuous pathways of highly thermally conductive material (e.g., greater than the bulk thermal conductivity of the polymer (e.g., a silicone polymer has a conductivity of approximately 0.25 W/mK)). The continuous pathway of highly thermally conductive material results in improved thermal performance. FIG. 4 shows a representation of a body (e.g., layer) of a cured TIM composition such as described above. Body 400 includes TIM polymer 410, first filler particles 420, and second filler particles 430. In this representation, discrete first filler particles 420 are fused into continuous pathways of relatively high thermal conductivity by the use of second filler particles 430.

Gel TIM compositions including those incorporating chain extension technology, can be cured over a wide range of temperatures and/or times. The cure time and temperature (e.g., a temperature compatible with a melting point of the second filler) can be controlled by the choices of catalyst selection, catalyst concentration, and the optional use of catalyst inhibitors and retarders, known to those skilled in the art. In general, the chain extenders react more quickly than typical silicone crosslinkers, and, therefore, typically require modifications of the catalyst selection, concentration, inhibitors, etc. in order to provide a balance of reactivity during cure and sufficiently long shelf life and pot life.

In addition, embodiments of compositions may also contain other additives including, but not limited to, catalysts for the curing reaction, coupling agents for the filler, adhesion promoters, coloring agents, and other additives know to those skilled in the art.

Embodiments of compositions may be used as thermal interface materials in electronic packages that require the removal of heat. The packages may have a variety of form factors including pin grid arrays, ball grid arrays, and ball grid arrays with pinned interposers. The compositions are useful as the thermal interface material between the die and the integrated heat spreader (IHS) of flip-chip packages; however, they can be used in a variety of applications which a thermal interface material is needed between the chip and the heat removal hardware such as heat fins, fans, vapor chambers, and the like.

Figure 5:
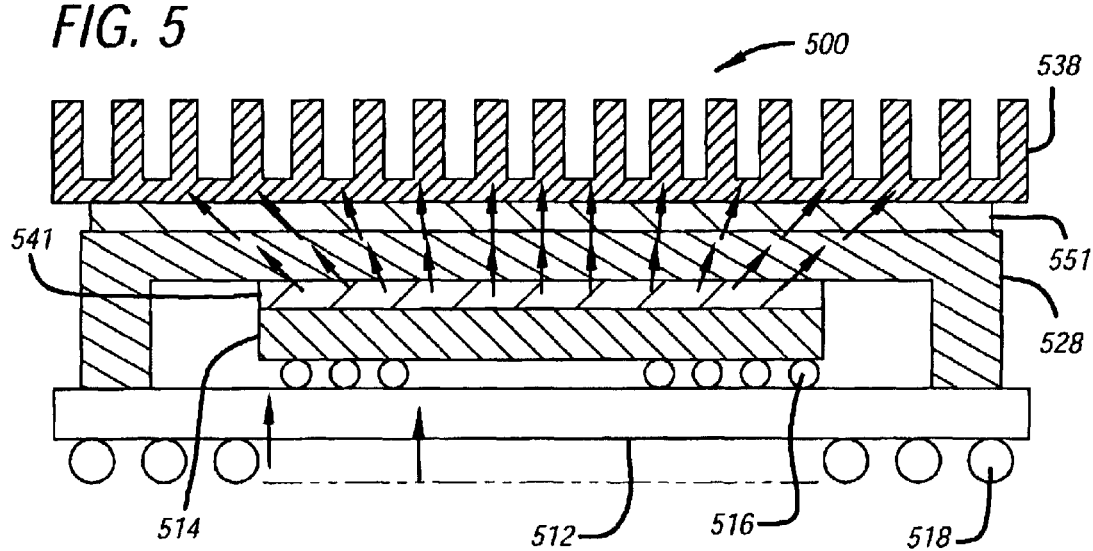
FIG. 5 is a schematic side view of an embodiment of an integrated circuit assembly.

FIG. 5 is a diagram illustrating an integrated circuit package assembly 500. In one embodiment, integrated circuit assembly 500 includes substrate 512 electrically connected to integrated circuit 514 by solder bumps 516 utilized in a process commonly referred to as controlled collapsed chip connection (C4). Although solder bumps 516 are shown and described, it is understood that integrated circuit 514 may be connected to substrate 512 by other means such as bond wire.

Integrated circuit assembly 500 may include a plurality of solder balls 418 that are attached to bottom surface 520 of substrate 512. Solder balls 518 may be reflowed to attach integrated circuit assembly 500 to a printed circuit board (not shown). A printed circuit board may be suitable, for example, as a computer motherboard. Substrate 512 may contain routing traces, surface pads, power/ground planes and vias, etc., which electrically connect solder balls 518 with solder bumps 516. Although solder balls 518 are shown and described, it is to be understood that the integrated circuit assembly 500 may have other contacts such as pins.

Integrated circuit 514 generates heat, which must be removed from integrated circuit assembly 500. Thermal element 528 may be thermally coupled to integrated circuit 514 to facilitate the removal of heat from integrate circuit 514. Thermal element 528 may be an integrated heat spreader (IHS). A heat spreader may include metal and metal alloys optionally with a coating of another metal or may include a thermally conductive composite material. To decrease the thermal impedance between integrated circuit 514 and thermal element 528 and to secure thermal element 528 to integrated circuit 514 curable TIM 541 may be used (a curable TIM composition such as described above).

Overlying thermal element 528 in the embodiment shown in FIG. 5 is another thermal element. In this embodiment, thermal element 538 is a heat sink having a number of fins and a base connected to a superior surface (as viewed) of thermal element 528. Thermal element 538 is connected/secured to thermal element 528 by TIM 551. TIM 551 may be any material suitable for a desired application such as a phase change material or thermal grease. Factors for selection of a TIM material include the ease of use as well as the thermal impedance of the material. In one embodiment, TIM 551 is a composition such as described above including, for example, component 100, component 200, and at least two fillers where one filler has a melting point less than the other filler and that is cured at a melting point above the melting point of one of the fillers. In another embodiment, TIM 551 and TIM 541 are compositions such as described above, including the same composition. In yet another embodiment, TIM 551 is a composition such as described above and TIM 541 is another different composition.

It is appreciated that integrated circuit assembly 500 describe one type of thermal management system. A TIM composition such as described herein can have applications in various other thermal management systems such as those involving heat pipes, thermal plates, etc.

In the preceding detailed description, specific embodiments are presented. It will, however, be evident that various modifications and changes may be made thereto without departing from the broader spirit and scope of the claims. The specification and drawings are, accordingly, to be regarded in an illustrative rather than a restrictive sense.

What is claimed is:

1. A composition comprising:

an amount of at least one vinyl terminated polymer;

an amount of at least one cross-linker comprising a terminal Si—H unit;

an amount of at least one thermally conductive first filler; and an amount of at least one thermally conductive second filler, wherein a melting point of the first filler is greater than the melting point of the second filler.

2. The composition of claim 1, wherein the at least one vinyl terminated polymer comprises a silicone moiety.

3. The composition of claim 2, wherein the at least one cross-linker comprises a silicone moiety.

4. The composition of claim 1, wherein an amount of the second filler is less than 30 percent by volume.

5. The composition of claim 1, wherein the second filler is selected from a group consisting of indium, indium-silver alloy, indium-tin alloy, tin, tin-bismuth alloy, tin-indium-bismuth alloy, gallium-tin-indium alloy, gallium-indium-tin-zinc alloy, and indium-bismuth alloy.

6. The composition of claim 1, wherein the first filler comprises an average particle size of less than 30 microns.

7. The composition of claim 1, wherein the first filler comprises a bulk thermal conductivity greater than 50 W/mK.

8. The composition of claim 7, wherein the first filler comprises a mixture of aluminum and zinc oxide.

9. An apparatus comprising:

a package configured to mate with a printed circuit board;

a semiconductor device coupled to the package;

a thermal element; and a curable thermal material disposed between the thermal element and the semiconductor device comprising:

an amount of at least one vinyl terminated silicone polymer;

an amount of at least one silicone cross-linker comprising a terminal Si—H unit;

an amount of at least one thermally conductive first filler; and an amount of at least one thermally conductive second filler, wherein a melting point of the first filler is greater than the melting point of the second filler.

10. The apparatus of claim 9, wherein an amount of the second filler of the thermal material is less than 30 percent by volume.

11. The apparatus of claim 9, wherein the second filler of the thermal material is selected from a group consisting of indium, indium-silver alloy, indium-tin alloy, tin, tin-bismuth alloy, tin-indium-bismuth alloy, gallium-tin-indium alloy, gallium-indium-tin-zinc alloy, and indium-bismuth alloy.

12. The apparatus of claim 9, wherein the first filler of the thermal material comprises an average particle size of less than 30 microns.

13. The apparatus of claim 12, wherein the first filler of the thermal material comprises a bulk thermal conductivity greater than 50 W/mK.

14. The apparatus of claim 9, further comprising a printed circuit board, wherein the package is coupled to the printed circuit board.

15. An apparatus comprising:
a package configured to mate with a printed circuit board;
a semiconductor device coupled to the package;
a first thermal element;
a second thermal element; and
a curable thermal material disposed between the first thermal element and the second thermal element comprising:
an amount of at least one vinyl terminated silicone polymer;
an amount of at least one silicone cross-linker comprising a terminal Si—H unit;
an amount of at least one thermally conductive first filler; and
an amount of at least one thermally conductive second filler, wherein a melting point of the first filler is greater than the melting point of the second filler.

16. The apparatus of claim 15, wherein an amount of the second filler of the thermal material is less than 30 percent by volume.

17. The apparatus of claim 15, wherein the second filler of the thermal material is selected from a group consisting of indium, indium-silver alloy, indium-tin alloy, tin, tin-bismuth alloy, tin-indium-bismuth alloy, gallium-tin-indium alloy, gallium-indium-tin-zinc alloy, and indium-bismuth alloy.

18. The apparatus of claim 15, wherein the first filler of the thermal material comprises an average particle size of less than 30 microns.

19. The apparatus of claim 18, wherein the first filler of the thermal material comprises a bulk thermal conductivity greater than 50 W/mK.

* * * * *